(12) United States Patent
Brons et al.

(10) Patent No.: US 9,281,002 B2
(45) Date of Patent: Mar. 8, 2016

(54) MATERIALS FOR NEAR FIELD TRANSDUCERS AND NEAR FIELD TRANSDUCERS CONTAINING SAME

(71) Applicant: SEAGATE TECHNOLOGY LLC, Cupertino, CA (US)

(72) Inventors: Justin Glen Brons, Bloomington, MN (US); Tong Zhao, Eden Prairie, MN (US); Sethuraman Jayashankar, Excelsior, MN (US); Steve C. Riemer, Minneapolis, MN (US); Michael C. Kautzky, Eagan, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/313,528

(22) Filed: Jun. 24, 2014

(65) Prior Publication Data

US 2014/0376347 A1 Dec. 25, 2014

Related U.S. Application Data

(60) Provisional application No. 61/838,405, filed on Jun. 24, 2013, provisional application No. 61/838,393, filed on Jun. 24, 2013, provisional application No. 61/897,303, filed on Oct. 30, 2013, provisional application No. 61/838,398, filed on Jun. 24, 2013, provisional application No. 61/838,626, filed on Jun. 24, 2013, provisional application No. 61/984,915, filed on Apr. 28, 2014.

(51) Int. Cl.
*G11B 11/00* (2006.01)
*G11B 13/08* (2006.01)
(Continued)

(52) U.S. Cl.
CPC . *G11B 13/08* (2013.01); *C01F 7/00* (2013.01); *C01G 5/00* (2013.01); *C22C 5/02* (2013.01); *C22C 5/06* (2013.01); *C22C 9/02* (2013.01); *C22C 9/08* (2013.01); *C22C 11/04* (2013.01); *C22C 13/00* (2013.01); *C22C 18/02* (2013.01); *C22C 19/03* (2013.01); *C22C 20/00* (2013.01);
(Continued)

(58) Field of Classification Search
CPC ............ G11B 5/4866; G11B 2005/0021; G11B 5/6088; G11B 2005/001; G11B 5/314; G11B 7/1387; G11B 5/3116; G11B 13/045; G11B 5/3133; G11B 5/3136; G11B 13/08
USPC .......... 369/13.33, 13.32, 13.24, 13.14, 13.03, 369/13.12, 13.13, 13.22, 13.01, 13.35, 369/112.27; 360/59, 125.31, 125.74
See application file for complete search history.

(56) References Cited

U.S. PATENT DOCUMENTS 4,492,873 A 1/1985 Dmitriev
5,482,611 A 1/1996 Helmer
(Continued)

FOREIGN PATENT DOCUMENTS

EP 024088 10/1987
EP 0 580 368 A2 1/1994
(Continued)

OTHER PUBLICATIONS

U.S. Appl. No. 13/923,925, filed Jun. 21, 2013, Pitcher.
(Continued)

*Primary Examiner* — Ali Neyzari
(74) *Attorney, Agent, or Firm* — Mueting, Raasch & Gebhardt, P.A.

(57) ABSTRACT

Disclosed herein are near field transducers (NFTs) that include either silver, copper, or aluminum and one or more secondary elements.

20 Claims, 7 Drawing Sheets

(51) Int. Cl.

| | | |
|---|---|---|
| *G11B 5/31* | (2006.01) | |
| *G11B 7/1387* | (2012.01) | |
| *C22C 5/02* | (2006.01) | |
| *C22C 5/06* | (2006.01) | |
| *C22C 9/02* | (2006.01) | |
| *C22C 9/08* | (2006.01) | |
| *C22C 11/04* | (2006.01) | |
| *C22C 13/00* | (2006.01) | |
| *C22C 18/02* | (2006.01) | |
| *C22C 19/03* | (2006.01) | |
| *C22C 20/00* | (2006.01) | |
| *C22C 21/00* | (2006.01) | |
| *C22C 21/02* | (2006.01) | |
| *C22C 21/10* | (2006.01) | |
| *C22C 22/00* | (2006.01) | |
| *C22C 27/00* | (2006.01) | |
| *C22C 27/02* | (2006.01) | |
| *C22C 27/06* | (2006.01) | |
| *C22C 38/06* | (2006.01) | |
| *G11B 5/48* | (2006.01) | |
| *C01F 7/00* | (2006.01) | |
| *C01G 5/00* | (2006.01) | |
| *G11B 5/60* | (2006.01) | |
| *C23C 14/58* | (2006.01) | |
| *C22C 5/04* | (2006.01) | |
| *C22C 5/10* | (2006.01) | |
| *C22C 9/00* | (2006.01) | |
| *C22C 9/04* | (2006.01) | |
| *C22C 9/05* | (2006.01) | |
| *C22C 9/06* | (2006.01) | |
| *C22C 9/10* | (2006.01) | |
| *C22C 19/07* | (2006.01) | |
| *C22C 21/06* | (2006.01) | |
| *C22C 24/00* | (2006.01) | |
| *C22C 28/00* | (2006.01) | |
| *C22C 30/02* | (2006.01) | |
| *G11B 5/00* | (2006.01) | |
| *B32B 15/01* | (2006.01) | |

(52) U.S. Cl.
 CPC ............... *C22C 21/00* (2013.01); *C22C 21/003* (2013.01); *C22C 21/02* (2013.01); *C22C 21/10* (2013.01); *C22C 22/00* (2013.01); *C22C 27/00* (2013.01); *C22C 27/02* (2013.01); *C22C 27/025* (2013.01); *C22C 27/06* (2013.01); *C22C 38/06* (2013.01); *C23C 14/5833* (2013.01); *G11B 5/314* (2013.01); *G11B 5/3106* (2013.01); *G11B 5/4866* (2013.01); *G11B 5/6088* (2013.01); *G11B 7/1387* (2013.01); *B32B 15/01* (2013.01); *B32B 15/018* (2013.01); *C22C 5/04* (2013.01); *C22C 5/10* (2013.01); *C22C 9/00* (2013.01); *C22C 9/04* (2013.01); *C22C 9/05* (2013.01); *C22C 9/06* (2013.01); *C22C 9/10* (2013.01); *C22C 19/07* (2013.01); *C22C 21/06* (2013.01); *C22C 24/00* (2013.01); *C22C 28/00* (2013.01); *C22C 30/02* (2013.01); *G11B 5/3163* (2013.01); *G11B 2005/0021* (2013.01)

(56) References Cited

U.S. PATENT DOCUMENTS

| | | | |
|---|---|---|---|
| 5,849,093 A | 12/1998 | Andra | |
| 5,945,681 A | 8/1999 | Tokiguchi | |
| 6,130,436 A | 10/2000 | Renau | |
| 6,144,098 A | 11/2000 | Iyer | |
| 6,589,676 B1 | 7/2003 | Gui | |
| 6,632,483 B1 | 10/2003 | Callegari | |
| 6,641,932 B1 | 11/2003 | Xu | |
| 6,683,426 B1 | 1/2004 | Kleeven | |
| 6,795,630 B2 | 9/2004 | Challener | |
| 6,999,384 B2 | 2/2006 | Stancil | |
| 7,002,228 B2 | 2/2006 | Deak | |
| 7,018,729 B2 | 3/2006 | Pocker | |
| 7,032,427 B2 | 4/2006 | Niwa | |
| 7,262,936 B2 | 8/2007 | Hamann | |
| 7,272,079 B2 | 9/2007 | Challener | |
| 7,330,404 B2 | 2/2008 | Peng | |
| 7,377,228 B2 | 5/2008 | Mack | |
| 7,476,855 B2 | 1/2009 | Huang | |
| 7,544,958 B2 * | 6/2009 | Low | H01J 37/05 250/398 |
| 7,609,003 B2 * | 10/2009 | Horsky | H01J 27/205 250/423 R |
| 7,690,009 B2 | 3/2010 | Miyanishi | |
| 7,791,839 B2 | 9/2010 | Olson | |
| 7,961,417 B2 | 6/2011 | Seigler | |
| 7,965,464 B2 * | 6/2011 | Batra | G11B 5/1278 360/125.74 |
| 7,986,592 B2 | 7/2011 | Hirano | |
| 8,023,225 B2 | 9/2011 | Shimazawa | |
| 8,031,561 B2 * | 10/2011 | Hellwig | B82Y 10/00 369/13.01 |
| 8,040,761 B2 * | 10/2011 | Kawamori | G11B 5/3116 369/112.27 |
| 8,077,556 B2 | 12/2011 | Komura | |
| 8,107,325 B2 | 1/2012 | Komura | |
| 8,116,034 B2 | 2/2012 | Komura | |
| 8,116,176 B2 | 2/2012 | Kato | |
| 8,194,510 B2 | 6/2012 | Sasaki | |
| 8,194,511 B2 | 6/2012 | Sasaki | |
| 8,213,272 B2 | 7/2012 | Takayama | |
| 8,223,597 B2 | 7/2012 | Komura | |
| 8,248,891 B2 * | 8/2012 | Lee | G11B 5/314 360/125.74 |
| 8,284,521 B2 | 10/2012 | Ohtsu | |
| 8,284,635 B2 | 10/2012 | Matsumoto | |
| 8,289,650 B2 | 10/2012 | Seigler | |
| 8,320,220 B1 | 11/2012 | Yuan | |
| 8,325,567 B2 * | 12/2012 | Miyauchi et al. | 369/13.33 |
| 8,331,205 B2 | 12/2012 | Seigler | |
| 8,339,740 B2 | 12/2012 | Zou | |
| 8,351,151 B2 | 1/2013 | Katine | |
| 8,385,159 B2 | 2/2013 | Gao | |
| 8,400,902 B2 | 3/2013 | Huang | |
| 8,405,056 B2 * | 3/2013 | Amaldi | 250/396 R |
| 8,405,932 B2 | 3/2013 | Seigler | |
| 8,416,647 B1 * | 4/2013 | Zhao | G11B 5/3133 369/13.01 |
| 8,427,925 B2 * | 4/2013 | Zhao | B82Y 10/00 360/59 |
| 8,437,230 B2 * | 5/2013 | Aoki et al. | 369/13.33 |
| 8,451,555 B2 | 5/2013 | Seigler | |
| 8,477,454 B2 * | 7/2013 | Zou et al. | 360/125.31 |
| 8,514,673 B1 | 8/2013 | Zhao | |
| 8,553,505 B2 | 10/2013 | Rawat | |
| 8,670,215 B2 * | 3/2014 | Zou | G11B 5/314 360/125.31 |
| 8,675,457 B1 | 3/2014 | Hirata | |
| 8,711,662 B2 * | 4/2014 | Lee | G11B 5/314 369/13.33 |
| 8,773,959 B2 * | 7/2014 | Gao | G11B 5/314 369/112.27 |
| 8,830,800 B1 | 9/2014 | Pitcher | |
| 8,917,581 B1 | 12/2014 | Mallary | |
| 8,934,198 B2 * | 1/2015 | Zou et al. | 360/125.31 |
| 2005/0012052 A1 | 1/2005 | Platzgummer | |
| 2005/0190496 A1 | 9/2005 | Hamann | |
| 2006/0238133 A1 | 10/2006 | Horsky | |
| 2007/0069383 A1 | 3/2007 | Suzuki | |
| 2008/0230724 A1 | 9/2008 | Low | |
| 2009/0073858 A1 | 3/2009 | Seigler | |
| 2009/0130365 A1 | 5/2009 | Kojima | |
| 2009/0225636 A1 | 9/2009 | Hirano | |

(56) References Cited

U.S. PATENT DOCUMENTS

| | | |
|---|---|---|
| 2010/0103553 A1 | 4/2010 | Shimazawa |
| 2010/0123965 A1 | 5/2010 | Lee |
| 2010/0123967 A1 | 5/2010 | Batra |
| 2010/0128579 A1 | 5/2010 | Seigler |
| 2010/0149930 A1 | 6/2010 | Komura |
| 2010/0157746 A1 | 6/2010 | Hongo |
| 2010/0190036 A1 | 7/2010 | Komvopoulos |
| 2010/0214685 A1 | 8/2010 | Seigler |
| 2010/0309581 A1 | 12/2010 | Wu |
| 2010/0315736 A1 | 12/2010 | Takayama |
| 2010/0320403 A1 | 12/2010 | Amaldi |
| 2010/0329085 A1 | 12/2010 | Kawamori |
| 2011/0006214 A1 | 1/2011 | Bonig |
| 2011/0026161 A1 | 2/2011 | Ikeda |
| 2011/0038236 A1 | 2/2011 | Mizuno |
| 2011/0058272 A1 | 3/2011 | Miyauchi |
| 2011/0096431 A1 | 4/2011 | Hellwig |
| 2011/0122735 A1 | 5/2011 | Kato |
| 2011/0205863 A1 | 8/2011 | Zhao |
| 2012/0045662 A1 | 2/2012 | Zou |
| 2012/0105996 A1 | 5/2012 | Katine |
| 2012/0127839 A1 | 5/2012 | Rawat |
| 2012/0213042 A1 | 8/2012 | Aoki |
| 2013/0107679 A1 | 5/2013 | Huang |
| 2013/0161505 A1 | 6/2013 | Pitcher |
| 2013/0164453 A1 | 6/2013 | Pitcher |
| 2013/0164454 A1 | 6/2013 | Pitcher |
| 2013/0235707 A1 | 9/2013 | Zhao |
| 2013/0279315 A1 | 10/2013 | Zhao |
| 2013/0286799 A1 | 10/2013 | Zhu |
| 2013/0286804 A1 | 10/2013 | Zhao |
| 2013/0288077 A1 | 10/2013 | Dhawam |
| 2014/0004384 A1 | 1/2014 | Zhao |
| 2014/0043948 A1 | 2/2014 | Hirata |
| 2014/0050057 A1* | 2/2014 | Zou ................ G11B 33/144 369/13.33 |
| 2014/0113160 A1 | 4/2014 | Pitcher |

FOREIGN PATENT DOCUMENTS

| | | |
|---|---|---|
| EP | 0942072 | 9/1999 |
| EP | 1328027 | 7/2003 |
| EP | 2106678 | 10/2008 |
| JP | 2011198450 | 10/2011 |
| JP | 20111238991 | 12/2011 |
| TW | 200929183 | 7/2009 |
| WO | WO 97/45834 | 12/1997 |
| WO | WO 2013/163195 | 10/2013 |
| WO | WO 2013/163470 | 10/2013 |

OTHER PUBLICATIONS

U.S. Appl. No. 14/062,651, filed Oct. 24, 2013, Zou.

Al-Bayati et al., Junction Profiles of Sub keV Ion Implantation for Deep Sub-Quarter Micron Devices, *IEEE*, 2000, pp. 87-90.

Angel et al., "Enhanced Low Energy Drift-Mode Beam Currents in a High Current Ion Implanter," *IEEE*, 1999, pp. 219-222.

Druz et al., "Diamond-Like Carbon Films Deposited Using a Broad, Uniform Ion Beam from an RF Inductively Coupled CH4-Plasma Source", Diamond and Related Materials, vol. 7, No. 7, Jul. 1998, pp. 965-972.

Liu et al., "Influence of the Incident Angle of Energetic Carbon Ions on the Properties of Tetrahedral Amorphous Carbon (ta-C) films", *Journal of Vacuum Science and Technology*, vol. 21, No. 5, Jul. 25, 2003, pp. 1665-1670.

Metallization: "Metallization"; chapter 5, In: Kris v. Srikrishnan and Geraldine C. Schwartz: "Handbook of Semiconductor Interconnection Technology, Second Edition", 2006, CRC Press, Boca Raton, FL, USA, XP002711255, ISBN:978-1-4200-1765-6, pp. 311-382, Section 5.4.1.2 Adhesion; p. 320.

Piazza et al., "Large Area Deposition of Hydrogenated Amorphous Carbon Films for Optical Storage Disks", Diamond and Related Materials, vol. 13, No. 4-8, Apr. 2004, pp. 1505-1510.

Robertson, J., "Diamond-Like Amorphous Carbon," *Materials Science and Engineering R 37*, 2002, pp. 129-281.

Satoh et al., "Evaluation of Adhesion Materials for Gold Line-and-Space Surface Plasmon Antenna on SO1-MOS Photodiode", Silicon Nanoelectronics Workshop (SNW), 2010, *IEEE*, Piscataway, NJ, USA, Jun. 13, 2010, pp. 1-2.

Vogt, K.W. et al., "Characterization of Thin Titanium Oxide Adhesion Layers on Gold Resistivity, Morphology, and Composition", *Surface Science*, North-Holland, Amsterdam, NL, vol. 301, No. 1-3, Jan. 10, 1994, pp. 203-213.

Bannuru et al., "The Electrical and Mechanical Properties of Au-V and Au-V2O5 Thin Films for Wear-Resistant RF MEMS Switches", *Journal of Applied Physics*, 103, (2008), pp. 083522-1-083522-6.

Williams, et al., "Strengthening Gold Films with Zirconia Nanoparticles for MEMS Electrical Contacts", *ScienceDirect*, Acta Materialia 56, (2008), pp. 1813-1819.

PCT/US2013/038120 Search Report and Written Opinion dated Jul. 19, 2013 (8 pages).

\* cited by examiner

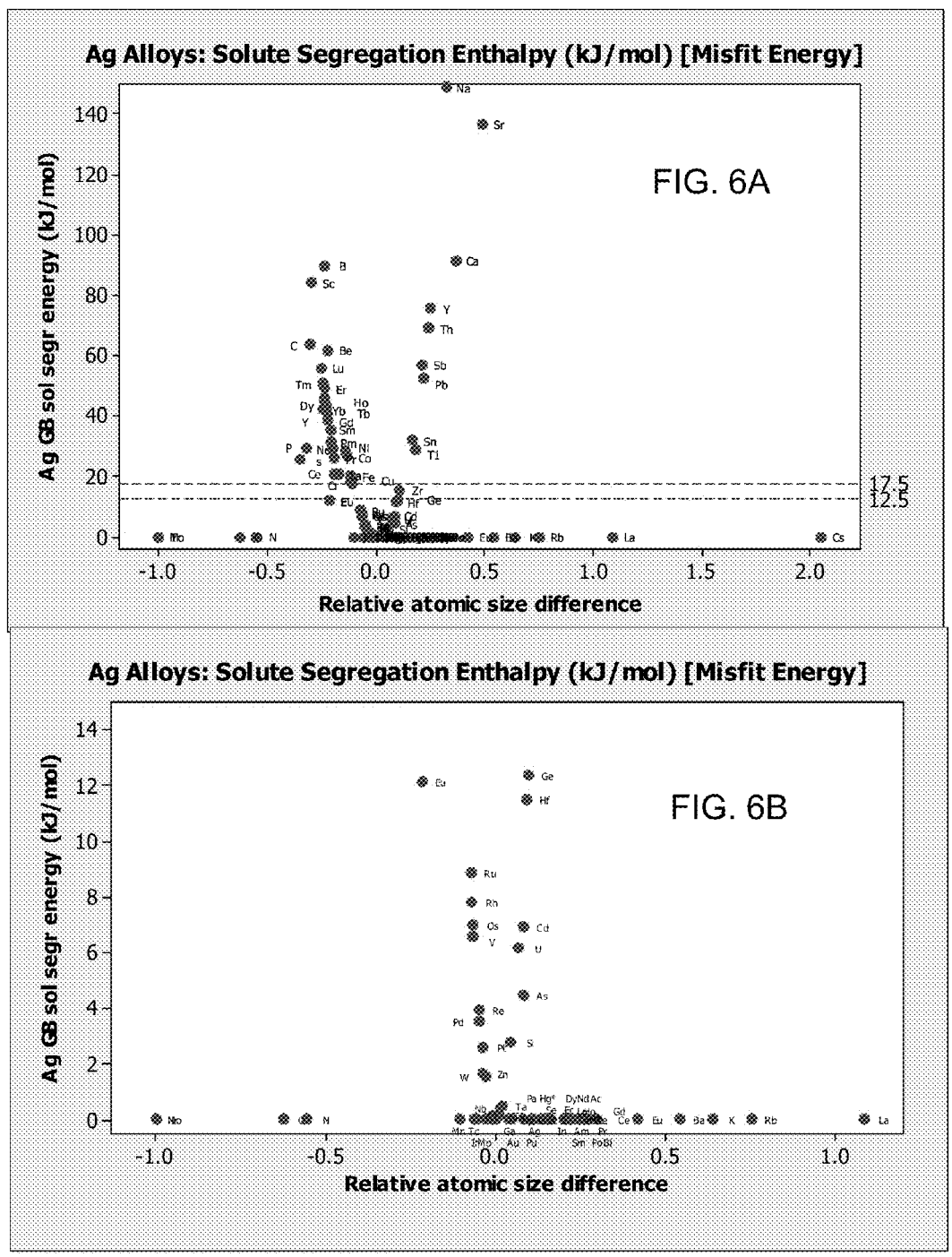

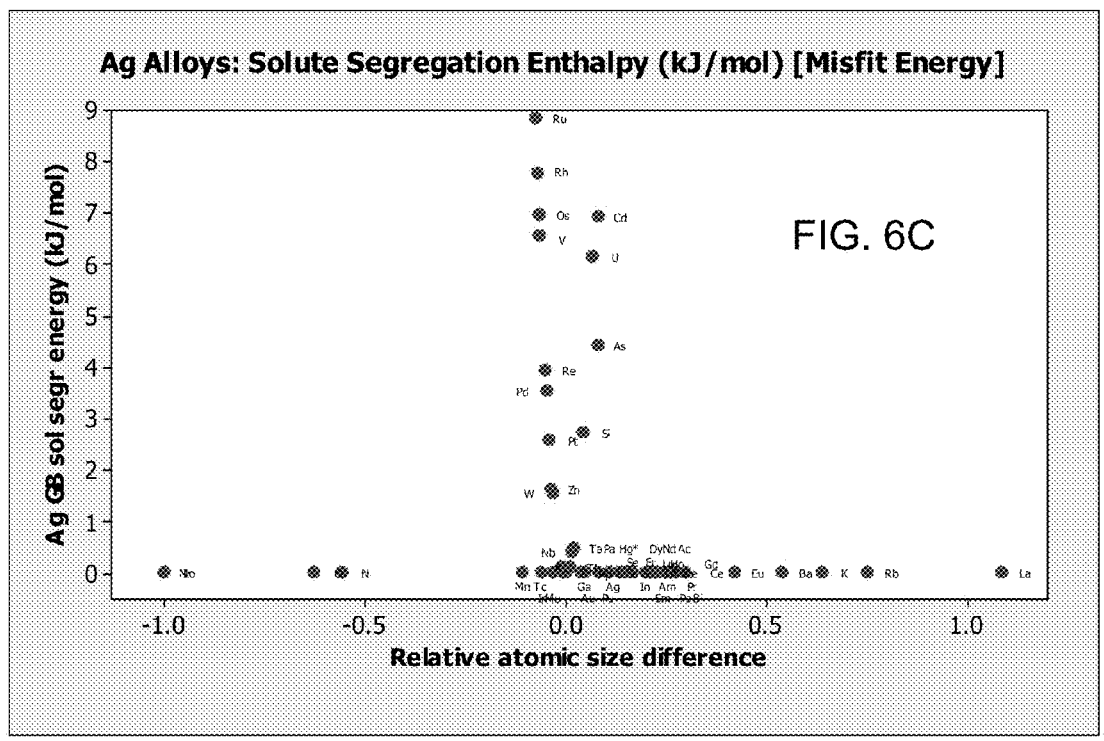

MATERIALS FOR NEAR FIELD TRANSDUCERS AND NEAR FIELD TRANSDUCERS CONTAINING SAME

PRIORITY

This application claims priority to U.S. Provisional Application Nos. 61/838,405 entitled "NEAR FIELD TRANSDUCER MATERIALS" filed on Jun. 24, 2013, 61/838,393 entitled "MATERIALS FOR NEAR FIELD TRANSDUCERS AND NEAR FIELD TRANSDUCERS INCLUDING THE SAME" filed on Jun. 24, 2013, 61/897,303 entitled "MATERIALS FOR NEAR FIELD TRANSDUCERS AND NEAR FIELD TRANSDUCERS INCLUDING THE SAME" filed on Oct. 30, 2013, 61/838,398 entitled "NEAR FIELD TRANSDUCERS AND METHODS OF FORMING THE SAME" filed on Jun. 24, 2013, 61/838,626 entitled "NEAR FIELD TRANSDUCERS AND METHODS OF FORMING THE SAME" filed on Jun. 24, 2013, and 61/984,915 entitled "METHODS OF FORMING NEAR FIELD TRANSDUCERS (NFTS) USING ION IMPLANTATION" filed on Apr. 28, 2014, the disclosure of which is incorporated herein by reference thereto.

SUMMARY

A device including a near field transducer, the near field transducer including silver (Ag) and at least one other secondary element, the at least one other secondary element chosen from: sodium (Na), thallium (Tl), bismuth (Bi), lead (Pb), potassium (K), cesium (Cs), rubidium (Rb), beryllium (Be), boron (B), manganese (Mn), or combinations thereof; and strontium (Sr), calcium (Ca), boron (B), scandium (Sc), carbon (C), beryllium (Be), yttrium (Y), thorium (Th), antimony (Sb), tin (Sn), thallium (Tl), lutetium (Lu), thulium (Tm), erbium (Er), holmium (Ho), ytterbium (Yb), gadolinium (Gd), samarium (Sm), promethium (Pm), praseodymium (Pr), sulfur (S), neodymium (Nd), phosphorus (P), cerium (Ce), lanthanum (La), iron (Fe), nitrogen (N), oxygen (O), molybdenum (Mo), and combinations thereof.

A device including a near field transducer, the near field transducer including copper (Cu) and at least one other secondary element, the at least one other secondary element chosen from: silver (Ag), cadmium (Cd), mercury (Hg), indium (In), antimony (Sb), sodium (Na), thallium (Tl), potassium (K), cesium (Cs), rubidium (Rb), bismuth (Bi), lead (Pb), tin (Sn), or combinations thereof.

A device including a near field transducer, the near field transducer including aluminum (Al) and at least one other secondary element, the at least one other secondary element chosen from: boron (B), beryllium (Be), antimony (Sb), tin (Sn), mercury (Hg), indium (In), lead (Pb), bismuth (Bi), thallium (Tl), sodium (Na), potassium (K), rubidium (Rb), cesium (Cs), or combinations thereof.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE FIGURES

FIGS. 6A, 6B, and 6C show the relative atomic size difference versus the grain boundary segregation energy of various elements.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Heat assisted magnetic recording (referred to through as HAMR) utilizes radiation, for example from a laser, to heat media to a temperature above its curie temperature, enabling magnetic recording. In order to deliver the radiation, e.g., a laser beam, to a small area (on the order of 20 to 50 nm for example) of the medium, a NFT is utilized. During a magnetic recording operation, the NFT absorbs energy from a laser and focuses it to a very small area; this can cause the temperature of the NFT to increase. The temperature of the NFT can be elevated up to about 400° C. or more.

The very high temperatures that the NFT reaches during operation can lead to diffusion of the material of the NFT (for example gold) from the peg and towards the disk. In addition, a portion of the NFT may be exposed at the air bearing surface of the recording head and is thus subject to mechanical wearing. NFT performance is greatly influenced by the heat and mechanical stress during HAMR operation. It would therefore be advantageous to have NFT devices that are more durable.

Disclosed devices can offer the advantage of providing more efficient transfer of energy from an energy source to the magnetic storage media to be heated, a smaller focal point at the point of heating, or some combination thereof. In some embodiments, disclosed devices can be used within other devices or systems, such as magnetic recording heads, more specifically, thermally or heat assisted magnetic recording (HAMR) heads, or disc drives that include such devices.

Figure 1:
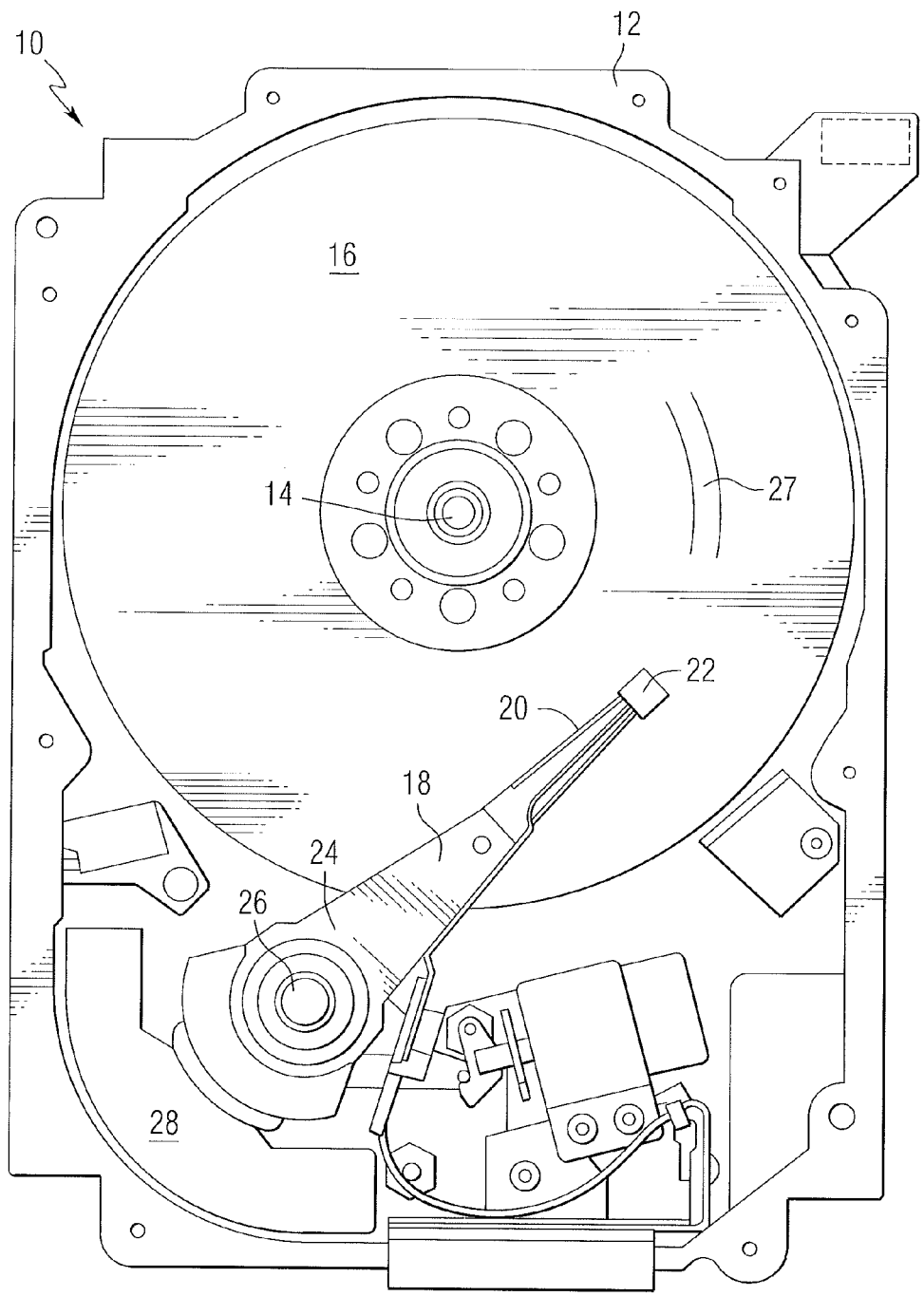
FIG. 1 is a pictorial representation of a data storage device in the form of a disc drive that can include a recording head constructed in accordance with an aspect of this disclosure.

Disclosed herein are NFTs and devices that include such NFTs. FIG. 1 is a pictorial representation of a data storage device in the form of a disc drive 10 that can utilize disclosed NFTs. The disc drive 10 includes a housing 12 (with the upper portion removed and the lower portion visible in this view) sized and configured to contain the various components of the disc drive. The disc drive 10 includes a spindle motor 14 for rotating at least one magnetic storage media 16 within the housing. At least one arm 18 is contained within the housing 12, with each arm 18 having a first end 20 with a recording head or slider 22, and a second end 24 pivotally mounted on a shaft by a bearing 26. An actuator motor 28 is located at the arm's second end 24 for pivoting the arm 18 to position the recording head 22 over a desired sector or track 27 of the disc 16. The actuator motor 28 is regulated by a controller, which is not shown in this view and is well-known in the art. The storage media may include, for example, continuous media or bit patterned media.

For heat assisted magnetic recording (HAMR), electromagnetic radiation, for example, visible, infrared or ultraviolet light is directed onto a surface of the data storage media to raise the temperature of a localized area of the media to facilitate switching of the magnetization of the area. Recent designs of HAMR recording heads include a thin film waveguide on a slider to guide light toward the storage media and a near field transducer to focus the light to a spot size smaller than the diffraction limit. While FIG. 1 shows a disc drive, disclosed NFTs can be utilized in other devices that include a near field transducer.

Figure 2:
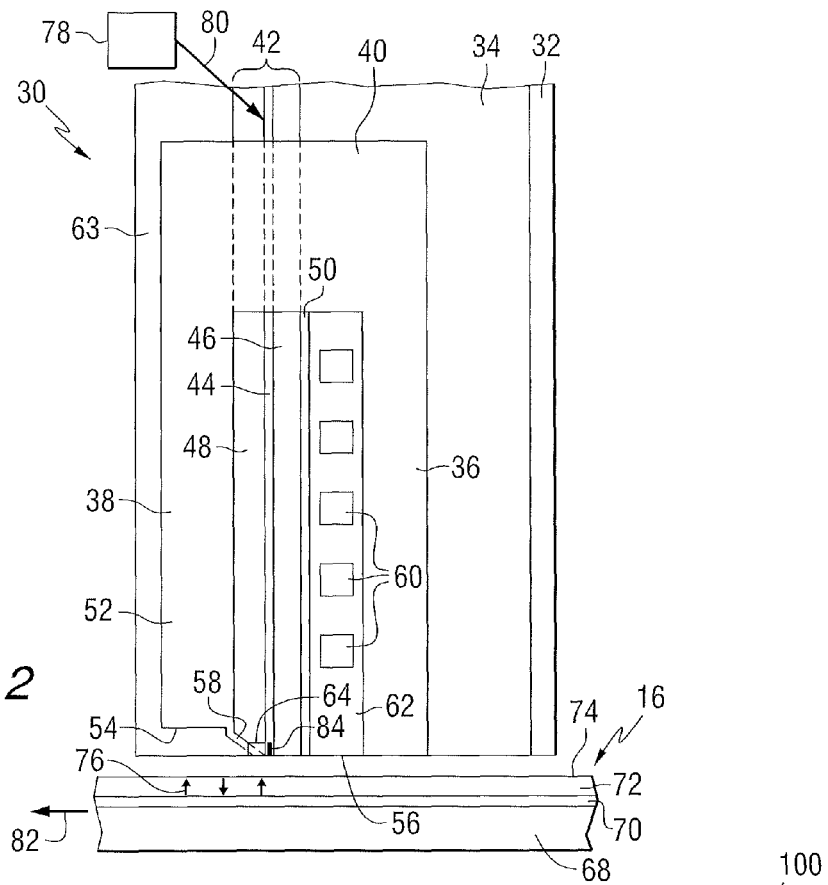
FIG. 2 is a side elevation view of a recording head constructed in accordance with an aspect of the invention.

FIG. 2 is a side elevation view of a recording head that may include a disclosed NFT; the recording head is positioned near a storage media. The recording head 30 includes a substrate 32, a base coat 34 on the substrate, a bottom pole 36 on the base coat, and a top pole 38 that is magnetically coupled to the bottom pole through a yoke or pedestal 40. A waveguide 42 is positioned between the top and bottom poles. The waveguide includes a core layer 44 and cladding layers 46 and 48 on opposite sides of the core layer. A mirror 50 is positioned adjacent to one of the cladding layers. The top pole is a two-piece pole that includes a first portion, or pole body 52, having a first end 54 that is spaced from the air bearing surface 56, and a second portion, or sloped pole piece 58, extending from the first portion and tilted in a direction toward the bottom pole. The second portion is structured to include an end adjacent to the air bearing surface 56 of the recording head, with the end being closer to the waveguide than the first portion of the top pole. A planar coil 60 also extends between the top and bottom poles and around the pedestal. In this example, the top pole serves as a write pole and the bottom pole serves as a return pole.

An insulating material 62 separates the coil turns. In one example, the substrate can be AlTiC, the core layer can be $Ta_2O_5$, and the cladding layers (and other insulating layers) can be $Al_2O_3$. A top layer of insulating material 63 can be formed on the top pole. A heat sink 64 is positioned adjacent to the sloped pole piece 58. The heat sink can be comprised of a non-magnetic material, such as for example Au.

As illustrated in FIG. 2, the recording head 30 includes a structure for heating the magnetic storage media 16 proximate to where the write pole 58 applies the magnetic write field H to the storage media 16. In this example, the media 16 includes a substrate 68, a heat sink layer 70, a magnetic recording layer 72, and a protective layer 74. However, other types of media, such as bit patterned media can be used. A magnetic field H produced by current in the coil 60 is used to control the direction of magnetization of bits 76 in the recording layer of the media.

The storage media 16 is positioned adjacent to or under the recording head 30. The waveguide 42 conducts light from a source 78 of electromagnetic radiation, which may be, for example, ultraviolet, infrared, or visible light. The source may be, for example, a laser diode, or other suitable laser light source for directing a light beam 80 toward the waveguide 42. Specific exemplary types of light sources 78 can include, for example laser diodes, light emitting diodes (LEDs), edge emitting laser diodes (EELs), vertical cavity surface emitting lasers (VCSELs), and surface emitting diodes. In some embodiments, the light source can produce energy having a wavelength of 830 nm, for example. Various techniques that are known for coupling the light beam 80 into the waveguide 42 may be used. Once the light beam 80 is coupled into the waveguide 42, the light propagates through the waveguide 42 toward a truncated end of the waveguide 42 that is formed adjacent the air bearing surface (ABS) of the recording head 30. Light exits the end of the waveguide and heats a portion of the media, as the media moves relative to the recording head as shown by arrow 82. A near-field transducer (NFT) 84 is positioned in or adjacent to the waveguide and at or near the air bearing surface. The heat sink material may be chosen such that it does not interfere with the resonance of the NFT.

Although the example of FIG. 2 shows a perpendicular magnetic recording head and a perpendicular magnetic storage media, it will be appreciated that the disclosure may also be used in conjunction with other types of recording heads and/or storage media where it may be desirable to concentrate light to a small spot.

Figure 3:
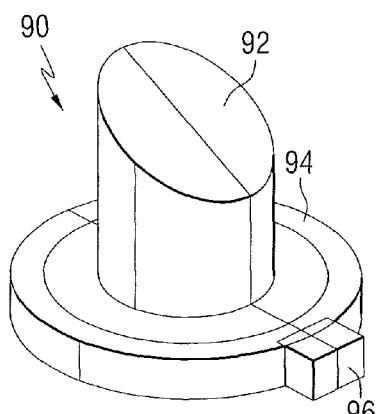
FIG. 3 is a schematic representation of a near field transducer.

FIG. 3 is a schematic view of a lollypop NFT 90 in combination with a heat sink 92. The NFT includes a disk shaped portion 94 and a peg 96 extending from the disk shaped portion. The heat sink 92 can be positioned between the disk shaped portion and the sloped portion of the top pole in FIG. 2. When mounted in a recording head, the peg may be exposed at the ABS and thus can be subjected to mechanical wearing.

Figure 4:
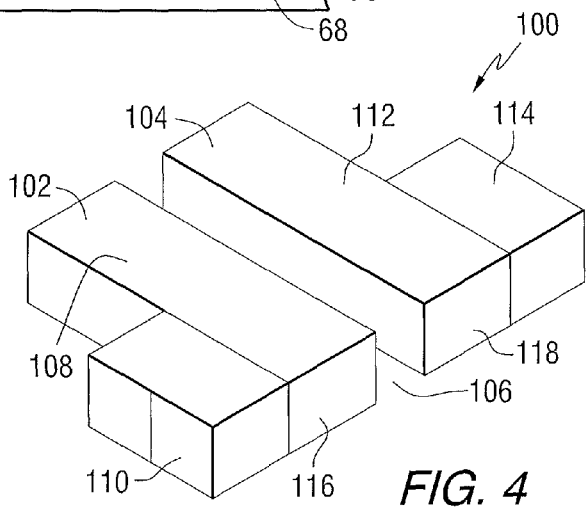
FIG. 4 is a schematic representation of another near field transducer.

FIG. 4 is a schematic view of a coupled nanorod (CNR) NFT 100. This NFT includes two nanorods 102 and 104 separated by a gap 106. Nanorod 102 includes a first portion 108 and a second portion 110. Nanorod 104 includes a first portion 112 and a second portion 114. When mounted in a recording head, the ends 116 and 118 of the nanorods may be exposed at the ABS and thus be subject to mechanical wearing. FIGS. 3 and 4 show example NFTs. However, the disclosure is not limited to any particular type of NFT. The materials described below may be used in various NFT configurations.

Disclosed NFTs may be made of a primary atom and at least one secondary atom. In some embodiments, the primary atom may have a higher atomic percentage (at %) in the NFT. In some embodiments, the primary atom may be silver (Ag), copper (Cu), or aluminum (Al). In some embodiments, more than one secondary atom is included in a NFT. A secondary atom(s) may be chosen by considering one or more properties of a material, mechanisms of atomic diffusion, or combinations thereof. Illustrative properties that can be considered can include enthalpy of mixing between the alloying element and the matrix element, enthalpy of segregation between the alloying element and the matrix element, plastic deformation, grain growth, and stress relaxation and creep, for example. Some of these properties have also been identified as the cause of various NFT failures.

In some embodiments, materials formed from a primary element and at least one secondary element can show relatively high resistance to grain growth, relatively high resistance to stress relaxation, enhanced hardness, high thermal conductivity, improved corrosion resistance, or some combination thereof.

In some embodiments, useful NFT materials can have optical properties that enable efficient coupling of incident light to the surface plasmons and effective energy transfer to the magnetic medium. The optical properties of NFT materials are often characterized by their optical refractive index (n) and extinction coefficient (k) which can be measured by ellipsometry. From the n and k values, the real and imaginary part of the dielectric constant (permittivity) can be calculated by: $\in_1 = n^2 - k^2$ and $\in_2 = 2nk$. The plasmonic effect arises from the negative real part of the dielectric constant of the material. The strength of plasmonic coupling depends on the absolute value of $\in_1$. On the other hand, the surface plasmon mode needs to propagate over a substantial distance. The loss of this propagation is proportional to the imaginary part of the dielectric $\in_2$. A good plasmonic material will have high $|\in_1|$ and low $\in_2$. Hence a figure-of-merit (FOM) has been developed to characterize the "goodness" of plasmonic materials: FOM=$3*|\in_1/\in_2|$.

The property of grain growth can be relevant to the ability of an alloy to function in a NFT. One of the sources for silver, copper, or aluminum deformation is significant grain growth at high temperatures. By alloying with other soluble metal atoms, the grain size of the alloy can be reduced and the grain growth can be impeded. The segregation of a second element to the grain boundaries of a metal can provide stabilization at the nanocrystalline level. In addition to slowing the migration kinetics of grain boundaries, segregated atoms can perform a primary stabilization function by lowering the energy associated with the grain boundary. This lowering of the grain boundary energy occurs numerically as a function of the enthalpy of grain boundary segregation and the amount of excess solute at the grain boundaries.

For the case of nanocrystalline stabilization, segregating alloying additions are specifically desirable. In order to identify which elements are best suited for segregation in stabilization in nanocrystalline environments, the enthalpy of mixing and the enthalpy of grain boundary segregation should both be positive, with an enthalpy of segregation higher than 20 kJ/mol and a ratio of Hseg/Hmix≥1. If the alloying elements are chosen correctly to coincide with this, the inherent driving force for this grain growth can actually be removed entirely. It is thought, but not relied upon that impeding grain growth can be the result of: a larger area of grain boundary that restrains the dislocation movement; and the localized strain fields by impurities that hinder the dislocation motion.

Figure 7:
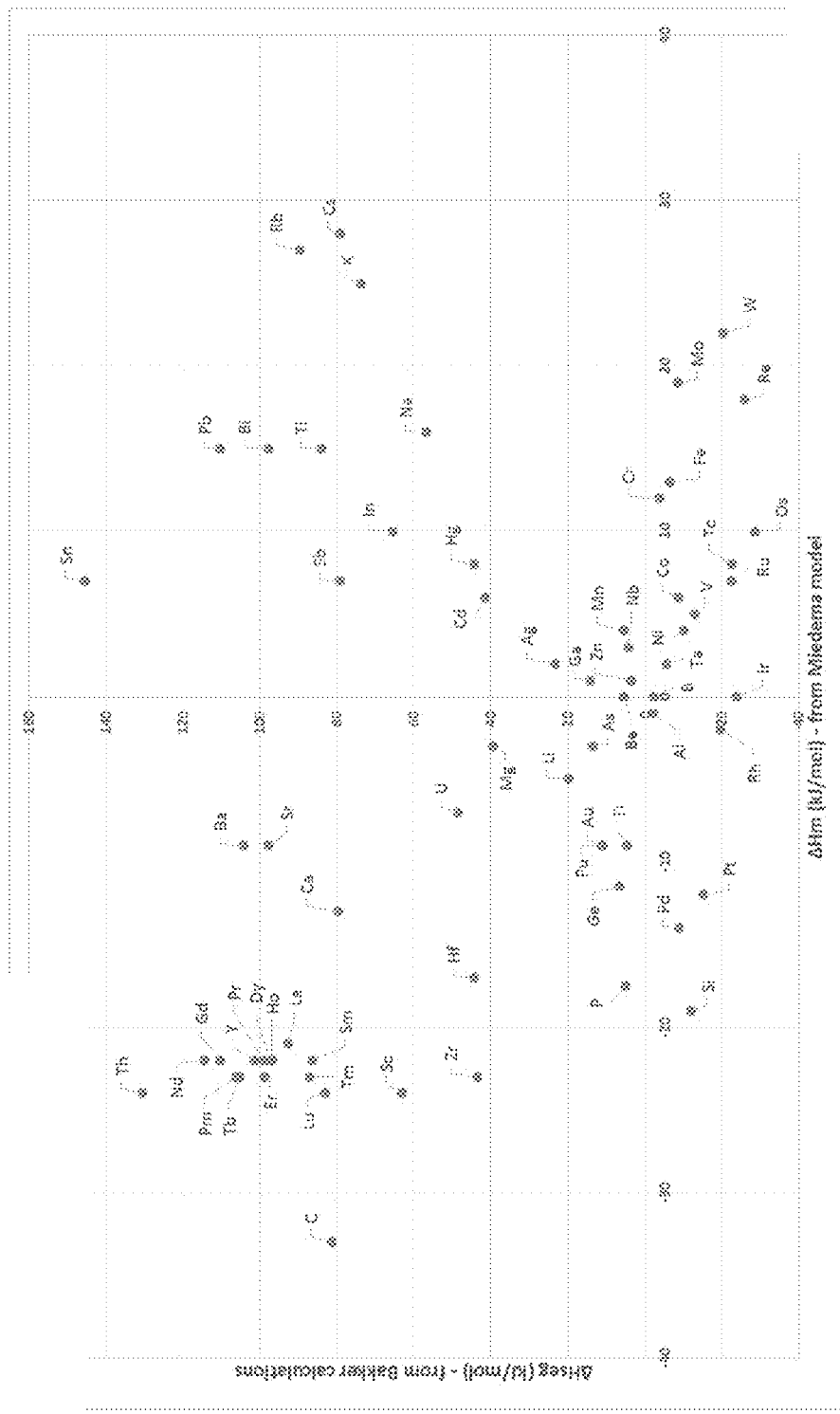
FIG. 7 shows the enthalpy of mixing vs enthalpy of grain boundary segregation for alloying elements in a copper matrix.
Figure 8:
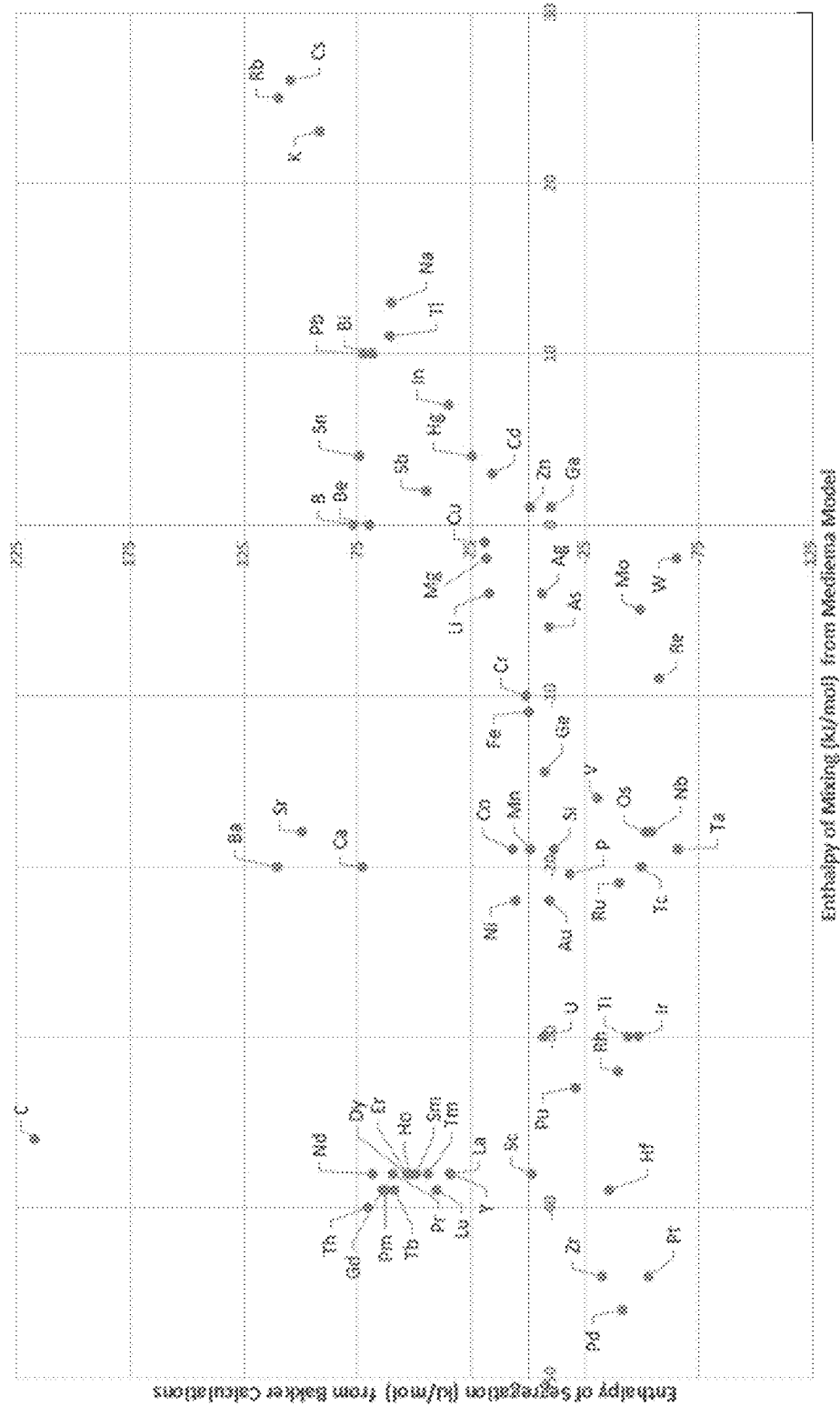
FIG. 8 shows the enthalpy of mixing vs enthalpy of grain boundary segregation for alloying elements in an aluminum matrix.

Enthalpies of mixing and of grain boundary segregation assuming a silver matrix, a copper matrix, and an aluminum matrix have been calculated. From these calculations, particular secondary elements have been identified that may provide stabilizing effects to a nanocrystalline state. The calculations for the primary element being silver are shown in FIG. 5, the primary element being copper are shown in FIG. 7 and the primary element being aluminum are shown in FIG. 8.

Figure 5:
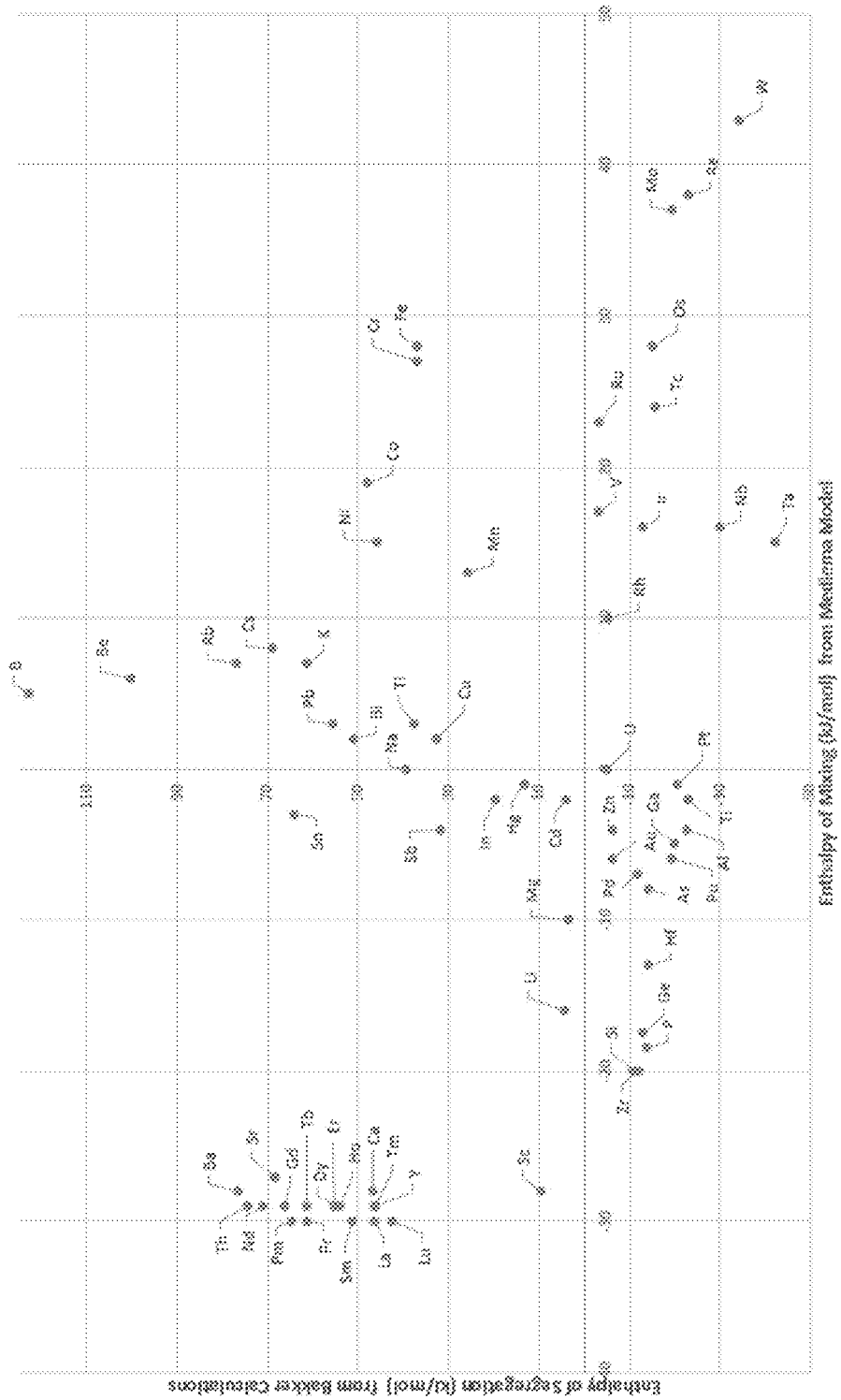
FIG. 5 shows the enthalpy of mixing vs enthalpy of grain boundary segregation for alloying elements in a silver matrix.

FIG. 5 affords selection of secondary elements for instances in which the primary element is silver (Ag). In some embodiments, a NFT can include silver (Ag) as a primary element and at least one secondary element selected from: sodium (Na), thallium (Tl), bismuth (Bi), lead (Pb), potassium (K), cesium (Cs), rubidium (Rb), beryllium (Be), boron (B), manganese (Mn), or combinations thereof for example. In some embodiments, a NFT can include silver (Ag) as a primary element and at least one secondary element selected from: boron (B), beryllium (Be), bismuth (Bi), and cesium (Cs), or combinations thereof for example.

In some embodiments, secondary atom(s) can also be chosen based on other considerations. For example, secondary atom(s) can be chosen based on mechanistic considerations involved in pinning grain growth. The NFT grain and interface boundary can be atomically engineered by the preferential adsorption of secondary atom(s) in order to pin the grain boundary and improve the grain boundary migration resistance of a NFT that includes, a primary atoms, such as gold for example. This can also be described as utilizing minor alloying elements (e.g., secondary atom(s)) to alter the fundamental grain boundary migration kinetics of the primary atom (e.g., gold). Mechanical high temperature reliability of the NFT may therefore be improved by intentional microalloying additions of one or more secondary atom(s) into the NFT material. Such intentional alloying can pin the grain boundary movement by the so called "solute drag" effect, making it harder for the peg to recess.

Disclosed concepts may provide stable NFT element dimensions during operating temperatures by pinning grain growth. This concept utilizes the preferential placement of secondary atoms at the grain boundaries of the NFT material to pin grain movement. The secondary atoms are chosen such that the total strain energy and total chemical potential energy of the system of atoms is reduced when they are at the grain boundary. Thus the grain boundary secondary atom is in a potential "well" and therefore "locks" the movement of the grain boundary.

The preferential placement of secondary atoms can be accomplished by facilitating the movement of secondary atoms to the grain boundaries. Such secondary atoms may be able to stabilize the NFT against grain growth through the following mechanisms: increased drag force on the moving grain boundary due to the binding chemical potential and elastic strain interaction of secondary atom to the grain boundary; reduction of grain boundary diffusion by poisoning of the primary atom (e.g., gold) grain boundary by the tightly adsorbed secondary atoms blocking of the diffusion jump sites at the boundary by the secondary atoms; reduction of the efficiency of secondary atom transfer across the grain boundary by the secondary atom; change in the grain boundary structure brought about by the secondary atom; preferential formation of vacancy-secondary atom pairs and secondary atom-primary atom pairs at the grain boundary which make boundary migration harder; improving the grain boundary cohesion; or some combination thereof.

The selection of the secondary atom can be based, at least in part on considerations involving the energetics of segregation of the secondary atom to the grain boundary. One consideration is the size of the secondary atom. In some embodiments the size of the secondary atom can be less than the size of the primary atom. If such a relationship exists the secondary atom can occupy interstitial positions in the bulk and at the grain boundary. In a face centered cubic (FCC) structure, the octahedral site is the largest interstitial site. The same basic mechanism allows the secondary atom to poison the grain boundary/surface diffusivity. Secondary atoms having smaller radii may be more amenable to providing this effect. Grain boundary precipitants may also be formed based on the energetics of the system.

It should be understood, having read this disclosure, that grain boundaries as discussed herein include high angle and low angle grain boundaries, coherent and incoherent boundaries, tilt and twist boundaries, intergranular phases as well as high symmetry boundaries such as twin boundaries.

An important consequence of these considerations is that NFTs without secondary atom(s) will have higher grain boundary mobilities and lower stabilities. Thus NFTs as typically formulated will have lower resistance to grain boundary movement since, by definition, they do not have secondary atoms in the system that can preferentially locate to the grain boundary. They will therefore possess undesirable grain migration and reliability performance.

In contrast, disclosed NFTs can utilize a secondary atom(s) to pin the grain boundary. A secondary atom(s) present even at a few 10s or 100s of ppm may make a dramatic impact in curtailing the mobility of the grain boundaries. Secondary atom(s) which reduce the strain energy and chemical potential at the grain boundary may lead to preferential clustering of secondary atoms near the grain boundaries (called Cottrell atmospheres) which may provide locking mechanisms that impede grain boundary movement. It should be emphasized that the primary function of the secondary atom(s) is grain boundary mobility impairment, although other functions such as solid solution strengthening are also possible.

A secondary atom can be chosen based, at least in part, on the ability for preferential segregation of the secondary atom (solute atom) to the grain boundary. The secondary atom(s) preferentially bond to the grain boundary because of the lowering of the energy at the grain boundary. The choice of solute atom is thus governed by the Grain Boundary Segregation energy, which is the lowering of the system energy due to reduction of the elastic misfit strain energy and the electronic (valence) interaction energy. The choice of secondary atoms can be aided by the use of DFT computations, as well as electronegativity and atomic elastic strain field energy calculations.

Faster secondary atoms may lead to better pinning of the grain boundary. It is also understood that a combination of more than one secondary atom may lead to better pinning of the grain boundary due to efficient boundary interstitial site filling (space-fill efficiency) due to the combination of varying secondary atom atomic radii. This is analogous to achieving better space filling when a mixture of different sized balls is used rather than a single sized ball.

A possible advantage of utilizing the solute drag method of grain boundary stabilization is that very low concentrations of secondary atoms, compared to solid solution strengthening or precipitation hardening, is needed. This in turn minimizes the impact of the modification on the plasmonic properties. Larger grain sizes possess smaller grain boundary area, and therefore require lower amounts of solute phase to percolate the boundary. In fact, only several hundred ppm of secondary atom (dopant) concentration may produce a 3 to 4 order of magnitude change in the grain boundary mobility. Initially the grain boundaries are pinned to the secondary atom atmospheres thereby immobilizing them. As the temperature is raised, the secondary atoms gain vibrational energy. The boundary then has an increasing tendency to decouple from the solute atoms pinning it. At a certain temperature, the boundary breaks away from the secondary atoms surrounding it. The breakaway temperature of the grain boundary is related to the concentration of secondary atoms at the boundary. Higher secondary atom concentrations at the boundary lead to higher break away temperatures.

FIG. 6A show the solute segregation enthalpy of various atoms. Useful atoms may have a higher propensity to grain boundary segregation and solute drag stabilization. As a general rule, elements with misfit energies (grain boundary solute segregation energies) higher than 12.5 kJ/mol may tend to easily segregate to the grain boundary. Therefore all the elements with segregation energies above the dashed lines can be considered candidates for alloying elements for solute drag strengthening of the Ag NFT.

In some embodiments a NFT can include silver (Ag) as the primary element and at least one secondary element selected from: sodium (Na), strontium (Sr), calcium (Ca), boron (B), scandium (Sc), carbon (C), beryllium (Be), yttrium (Y), thorium (Th), antimony (Sb), lead (Pb), tin (Sn), thallium (Tl), lutetium (Lu), thulium (Tm), erbium (Er), holmium (Ho), ytterbium (Yb), gadolinium (Gd), samarium (Sm), promethium (Pm), praseodymium (Pr), sulfur (S), neodymium (Nd), phosphorus (P), cerium (Ce), lanthanum (La), iron (Fe), nitrogen (N), oxygen (O), molybdenum (Mo), and combinations thereof. In some embodiments a NFT can include silver (Ag) as the primary element and at least one secondary element selected from: calcium (Ca), boron (B), carbon (C), boron (B), yttrium (Y), thorium (Th), antimony (Sb), tin (Sn), nitrogen (N), or some combination thereof, for example In some embodiments a NFT can include silver (Ag) as the primary element and at least one secondary element selected from: cobalt (Co), nickel (Ni), copper (Cu), zirconium (Zr), magnesium (Mg), or combinations thereof for example.

Silver can be prone to tarnish. Therefore, the addition of a secondary element(s) can also improve the corrosion resistance of the silver. Such secondary elements may generally have low solute segregation energies below 15 kJ/mol as shown in FIG. 6A (FIGS. 6B and 6C are the same graph as FIG. 6A but have expanded scales at the lower end of the segregation enthalpy). Illustrative secondary element(s) that may also improve corrosion resistance can include, for example chromium (Cr), nickel (Ni), tantalum (Ta), rubidium (Rb), ruthenium (Ru), vanadium (V), gold (Au), palladium (Pd), platinum (Pt), aluminum (Al), or some combination thereof can be utilized as a secondary element. In some embodiments any element added to silver may improve the corrosion and tarnish resistance. In some embodiments, the atomic size difference between the silver (solvent) atom and the secondary atom (solute atom) should be no more than 15% and the electronegativity of the secondary atom should be within +/−0.5 units of the electronegativity of silver. In some embodiments, illustrative secondary element(s) can include carbon (C), boron (B), nitrogen (N), or combinations thereof for example.

FIG. 7 affords selection of secondary elements for instances in which the primary element is copper (Cu). In some embodiments, a NFT can include copper (Cu) as a primary element and at least one secondary element selected from: cadmium (Cd), mercury (Hg), indium (In), antimony (Sb), sodium (Na), thallium (Tl), potassium (K), cesium (Cs), rubidium (Rb), bismuth (Bi), lead (Pb), tin (Sn), or combinations thereof for example. In some embodiments, a NFT can include copper (Cu) as a primary element and at least silver (Ag) as a secondary element.

FIG. 8 affords selection of secondary elements for instances in which the primary element is aluminum (Al). In some embodiments, a NFT can include aluminum (Al) as a primary element and at least one secondary element selected from: boron (B), beryllium (Be), antimony (Sb), tin (Sn), mercury (Hg), indium (In), lead (Pb), bismuth (Bi), thallium (Tl), sodium (Na), potassium (K), rubidium (Rb), cesium (Cs), or combinations thereof for example Generally, a NFT can include a primary atom and at least one secondary atom. In some embodiments, the secondary element(s) can have an atomic percent (at %) that is not greater than 15 at %, and in some embodiments, not greater than 5 at %. In some embodiments, the secondary element(s) can have an at % that is not less than 0.01 at %, or in some embodiments not less than 0.1 at %.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, "top" and "bottom" (or other terms like "upper" and "lower") are utilized strictly for relative descriptions and do not imply any overall orientation of the article in which the described element is located.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. For example, a conductive trace that "comprises" silver may be a conductive trace that "consists of" silver or that "consists essentially of" silver.

As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Use of "first," "second," etc. in the description above and the claims that follow is not intended to necessarily indicate that the enumerated number of objects are present. For example, a "second" substrate is merely intended to differentiate from another infusion device (such as a "first" substrate). Use of "first," "second," etc. in the description above and the claims that follow is also not necessarily intended to indicate that one comes earlier in time than the other.

Thus, embodiments of materials for near field transducers and near field transducers containing the same are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A device comprising:
   a near field transducer, the near field transducer comprising silver (Ag) and at least one other secondary element, the at least one other secondary element chosen from the group consisting of:
      sodium (Na), thallium (Tl), bismuth (Bi), lead (Pb), potassium (K), cesium (Cs), rubidium (Rb), beryllium (Be), boron (B), manganese (Mn), or combinations thereof; and
      strontium (Sr), calcium (Ca), scandium (Sc), carbon (C), yttrium (Y), thorium (Th), antimony (Sb), lutetium (Lu), thulium (Tm), erbium (Er), holmium (Ho), ytterbium (Yb), gadolinium (Gd), samarium (Sm), promethium (Pm), praseodymium (Pr), sulfur (S), neodymium (Nd), phosphorus (P), cerium (Ce), lanthanum (La), nitrogen (N), oxygen (O), and combinations thereof.

2. The device according to claim 1, wherein the NFT comprises at least two secondary elements.

3. The device according to claim 1, wherein the NFT comprises about 0.1 atomic percent to about 15 atomic percent of the at least one secondary element.

4. The device according to claim 1, wherein the NFT comprises about 0.1 atomic percent to about 5 atomic percent of the at least one secondary element.

5. The apparatus according to claim 1 further comprising an energy source.

6. The device according to claim 5 further comprising a waveguide, wherein the energy source, waveguide and near field transducer are configured to transmit light from the energy source to the waveguide and finally the near field transducer.

7. The device according to claim 6 further comprising a magnetic reader; and a magnetic writer, wherein the light source and the near field transducer are configured to transmit light from the light source to the near field transducer in order to assist the magnetic writer in writing.

8. A device comprising:
   a near field transducer, the near field transducer comprising copper (Cu) and at least one other secondary element, the at least one other secondary element chosen from the group consisting of:
      cadmium (Cd), mercury (Hg), indium (In), antimony (Sb), sodium (Na), thallium (Tl), potassium (K), cesium (Cs), rubidium (Rb), bismuth (Bi), lead (Pb), or combinations thereof.

9. The device according to claim 8, wherein the NFT comprises at least two secondary elements.

10. The device according to claim 8, wherein the NFT comprises about 0.1 atomic percent to about 15 atomic percent of the at least one secondary element.

11. The device according to claim 8, wherein the NFT comprises about 0.1 atomic percent to about 5 atomic percent of the at least one secondary element.

12. The apparatus according to claim 8 further comprising an energy source.

13. The device according to claim 12 further comprising a waveguide, wherein the energy source, waveguide and near field transducer are configured to transmit light from the energy source to the waveguide and finally the near field transducer.

14. The device according to claim 13 further comprising a magnetic reader; and a magnetic writer, wherein the light source and the near field transducer are configured to transmit light from the light source to the near field transducer in order to assist the magnetic writer in writing.

15. A device comprising:
   a near field transducer, the near field transducer comprising aluminum (Al) and at least one other secondary element, the at least one other secondary element chosen from the group consisting of:
      boron (B), beryllium (Be), antimony (Sb), mercury (Hg), indium (In), lead (Pb), bismuth (Bi), thallium (Tl), sodium (Na), potassium (K), rubidium (Rb), cesium (Cs), or combinations thereof.

16. The device according to claim 15, wherein the NFT comprises at least two secondary elements.

17. The device according to claim 15, wherein the NFT comprises about 0.01 atomic percent to about 5 atomic percent of the at least one secondary element.

18. The apparatus according to claim 15 further comprising an energy source.

19. The device according to claim 18 further comprising a waveguide, wherein the energy source, waveguide and near field transducer are configured to transmit light from the energy source to the waveguide and finally the near field transducer.

20. The device according to claim 19 further comprising a magnetic reader; and a magnetic writer, wherein the energy source and the near field transducer are configured to transmit light from the energy source to the near field transducer in order to assist the magnetic writer in writing.

\* \* \* \* \*